US008779077B2

United States Patent
Bazan et al.

(10) Patent No.: US 8,779,077 B2
(45) Date of Patent: Jul. 15, 2014

(54) ALL-CONJUGATED TRIBLOCK POLYELECTROLYTES ELECTRON INJECTION LAYER

(75) Inventors: Guillermo C. Bazan, Goleta, CA (US); Lei Ying, Goleta, CA (US); Zhao Chen, Goleta, CA (US); Thuc-Quyen Nguyen, Goleta, CA (US)

(73) Assignee: The Regents of the University of California, Oakland, CA (US)

( * ) Notice: Subject to any disclaimer, the term of this patent is extended or adjusted under 35 U.S.C. 154(b) by 63 days.

(21) Appl. No.: 13/415,470

(22) Filed: Mar. 8, 2012

(65) Prior Publication Data
US 2012/0232239 A1    Sep. 13, 2012

Related U.S. Application Data

(60) Provisional application No. 61/450,343, filed on Mar. 8, 2011.

(51) Int. Cl.
*C08G 79/08* (2006.01)
(52) U.S. Cl.
USPC ..................................... 528/8; 528/4; 257/40
(58) Field of Classification Search
USPC .................................. 525/8; 528/8, 4; 257/40
See application file for complete search history.

(56) References Cited

FOREIGN PATENT DOCUMENTS

WO    WO 2010125403 A1 * 11/2010
WO    WO 2011004203 A2 *  1/2011

OTHER PUBLICATIONS

Lu, S., et al. "Synthesis of conjugated-ionic block copolymers by controlled radical polymerization," Macromolecules, 2003, 36, 304-310.*
Huang, F., et al. "Synthesis and optical and electroluminescent properties of novel conjugated polyelectrolutes and their neutral precursors derived from fluorene and benzoselenadiazole," J. Polym. Sci. A, 2006, 44, 2521-2532.*
Fang, C., "Size-controllable enhanced energy transfer from an amphiphilic conjugated-ionic triblock copolymer to CdTe quantum dots in aqueous medium," J. Phys. Chem. C, 2008, 112, 7278-7283.*
Huang, F., et al., "Water/alcohol soluble conjugated polymers as highly efficient electron transporting/injection layer in optoelectronic devices", Chem. Soc. Rev. 2010, 39, 2500-2521.
Hoven, C. V., et al., "Recent Applications of Conjugated Polyelectrolytes in Optoelectronic Devices", Adv. Mater. 2008, 20, 3793-3810.
Feng, X. L.; et al, "Water-soluble fluorescent conjugated polymers and their interactions with biomacromolecules for sensitive biosensors", Chem. Soc. Rev. 2010, 39, 2411-2419.
Liu, B., et al., "Homogeneous Fluorescence-Based DNA Detection with Water-Soluble Conjugated Polymers", Chem. Mater. 2004, 16, 4467-4476.
Huang, F., et al., "Novel Electroluminescent Conjugated Polyelectrolytes Based on Polyfluorene", Chem. Mater. 2004, 16, 708-716.

(Continued)

*Primary Examiner* — Liam J Heincer
*Assistant Examiner* — Nicholas Hill
(74) *Attorney, Agent, or Firm* — Gates & Cooper LLP (57) ABSTRACT

A method for the production neutral triblock all-conjugated copolymers by palladium-catalyzed chain-growth polymerization, and methods to convert these copolymers into all-conjugated triblock polyelectrolytes with well-controlled molecular weight and polydispersity. A device is provided which incorporates such all-conjugated triblock polyelectrolytes as an electron injection layer.

13 Claims, 10 Drawing Sheets (56) References Cited

OTHER PUBLICATIONS

Huang, F., et al., "High-Efficiency, Environment-Friendly Electroluminescent Polymers with Stable High Work Function Metal as a Cathode: Green- and Yellow-Emitting Conjugated Polyfluorene Polyelectrolytes and Their Neutral Precursors", Am. Chem. Soc. 2004, 126, 9845-9853.

Yang, R. Q., et al., "Control of Cationic Conjugated Polymer Performance in Light Emitting Diodes by Choice of Counterion", J. Am. Chem. Soc. 2006, 128, 14422-14423.

Yang, R., et al., "Control of Interchain Contacts, Solid-State Fluorescence Quantum Yield, and Charge Transport of Cationic Conjugated Polyelectrolytes by Choice of Anion", J. Am. Chem. Soc. 2006, 128, 16532-16539.

Pu, K. Y., et al. "Design and Synthesis of Charge-Transfer-Based Conjugated Polyelectrolytes as Multicolor Light-Up Probes", Macromolecules 2009, 42, 5933-5940.

Tu, K. Y., et al., "Conjugated Triblock Copolymers Containing Both Electron-Donor and Electron-Acceptor Blocks", Macromolecules 2009, 42, 5933-5940.

Scherf, U.; et al., "All-Conjugated Block Copolymers" Acc. Chem. Res. 2008, 41, 1086-1097.

Tu, G. L.; et al, "Amphiphilic Conjugated Block Copolymers: Synthesis and Solvent-Selective Photoluminescence Quenching", Small 2007, 3, 1001-1006.

Gutacker, A., et al., "All-conjugated polyelectrolyte block copolymers", J. Mater. Chem. 2010, 20, 8, 1423-1430.

Miyakoshi, R., et al., "Catalyst-Transfer Polycondensation. Mechanism of Ni-Catalyzed Chain-Growth Polymerization Leading to Well-Defined Poly(3-hexylthiophene)", J. Am. Chem. Soc. 2005, 127, 17542-17547.

Iovu, M. C, et al., "Experimental Evidence for the Quasi-"Living" Nature of the Grignard Metathesis Method for the Synthesis of Regioregular", Macromolecules 2005, 38, 8649-8656.

Miyakoshi, R., et al., "Catalyst-Transfer Polycondensation for the Synthesis of Poly(p-phenylene) with Controlled Molecular Weight and Low Polydispersity", J. Am. Chem. Soc. 2006, 128, 16012-16013.

Stefan, M. C., et al. "Grignard Metathesis Method (GRIM): Toward a Universal Method for the Synthesis of Conjugated Polymers", Macromolecules 2009, 42, 30-32.

Yokoyama, A. et al, "Precision Synthesis of Poly(N-hexylpyrrole) and its Diblock Copolymer with Poly(p-phenylene) via Catalyst-Transfer Polycondensation", Macromolecules 2008, 41, 7271-7273.

Miyakoshi, R., et al., "Importance of the Order of Successive Catalyst-transfer Condensation Polymerization in the Synthesis of Block Copolymers of Polythiophene and Poly(p-phenylene)", Chem. Lett. 2008, 37, 1022-1023.

Javier, A. E., et al., "Chain-Growth Synthesis of Polyfluorenes with Low Polydispersities, Block Copolymers of Fluorene, and End-Capped Polyfluorenes: Toward New Optoelectronic Materials", Macromolecules 2010, 43, 3233-3237.

Wu, S. P., et al. "Synthesis and characterization of phenylene-thiophene all-conjugated diblock copolymers", Polymer 2009, 50, 6245-6251.

Wu, S. P. et al; "Grignard Metathesis Chain-Growth Polymerization for Poly(bithienylmethylene)s: Ni Catalyst Can Transfer across the Nonconjugated Monomer", Macromolecules 2010, 43, 4438-4440.

Ohshimizu, K., et al., "Well-Controlled Synthesis of Block Copolythiophenes", Macromolecules 2008, 41, 5289-5294.

Zhang, Y., et al. "Synthesis of All-Conjugated Diblock Copolymers by Quasi-Living Polymerization and Observation of Their Microphase Separation", J. Am. Chem. Soc. 2008, 130, 7812-7813.

Huang, L., et al., "Grignard Metathesis Chain-Growth Polymerization for Polyfluorenes", Macromolecules 2008, 41, 8944-8947.

Yokoyama, A., et al., "Chain-Growth Polymerization for the Synthesis of Polyfluorene via Suzuki-Miyaura Coupling Reaction from an Externally Added Initiator Unit" Am. Chem. Soc. 2007, 129, 7236-7237.

Yokozawa, T., et al. "Catalyst-Transfer Suzuki-Miyaura Coupling Polymerization for Precision Synthesis of Poly(p-phenylene)", Macromolecules 2010, 43, 7095-7100.

Lu, H. H., et al., "Self-Dopant Formation in Poly(9,9-di-n-octylfluorene) Via a Dipping Method for Efficient and Stable Pure-Blue Electroluminescence", Adv. Mater. 2007, 19, 2574-2579.

Ariu, M., et al.; "Exciton migration in B-phase poly(9,9-dioctylfluorene)", Phys. Rev. B 2003, 67, 195333.

Wu, H., et al., "Efficient Electron Injection from a Bilayer Cathode Consisting of Aluminum and Alcohol-/Water-Soluble Conjugated Polymers", Adv. Mater. 2004, 16, 1826-1830.

\* cited by examiner (i) PhPd(P$^t$Bu$_3$)Br, 2M Na$_2$CO$_3$, THF, rt for 10 min; (ii) MB or MA, rt for 10 min; (iii) MA or MB, rt for 10min;
(iv) Pyridine/Acetonitrile (1/1 in v/v), 85 °C for 24 h.

Scheme 1.
Figure 1

ALL-CONJUGATED TRIBLOCK POLYELECTROLYTES ELECTRON INJECTION LAYER

CROSS REFERENCE TO RELATED APPLICATIONS

The present application claims the benefit of co-pending U.S. Provisional Application Ser. No. 61/450,343 filed on Mar. 8, 2011, which is incorporated herein by reference in its entirety for all purposes.

FIELD OF THE INVENTION

The invention relates to a device incorporating and method for making novel triblock all-conjugated triblock copolymers and polyelectrolytes prepared from such triblocks. More specifically, the invention relates to the use of triblock polyelectrolytes as electron injection layers in polymer light emitting diodes.

BACKGROUND OF THE INVENTION

The application of fluorene-based conjugated polyelectrolytes (CPEs) as electron injection layer for the fabrication of multilayer polymer light emitting diodes (PLEDs) has attracted much attention.[1] As the interface between the emissive layer and cathode, the electron injection/transport ability would be influenced by the nanostructures of CPE films. However, since the most reported fluorene-based CPEs are either oligomers or polymers with alternative/random structures,[2] the morphology of CPEs can not be effectively controlled by common thermal-annealing or solution processing procedures.

To get well-organized film morphologies, a plausible method is to utilize copolymers containing immiscible multi-blocks which could potentially form ordered arrays in tens of nanometers.[3]. However, the synthesis of all-conjugated block copolyfluorenes is of great challenge, since the conventional aromatic coupling polycondensation procedure can not give well-defined molecular weight and low PDIs. The recent developed quasi-"living" Kumada reaction of Grignard-type monomers made it possible to synthesize polythiophenes,[4] polyphenylenes[5] polypyrroles[6] and their block copolymers[7] with controlled molecular weight and low PDI, however, this method was limited for synthesizing polyfluorene derivatives because of the unexpected chain transfer reaction.[6b, 8]

Recently, Yokozawa et al. reported an alternative quasi-"living" polymerization via Suzuki-Miyaura coupling reaction, which could achieve polyfluorenes with well-defined molecular weight and polydispersity (PDI) via chain-growth procedure.[9] The polymerization was performed with the initiation of 7-bromo-9,9-dialkyl-9H-fluoren-2-yl-boric acid ester (MA or MB) by $^tBu_3PPd(Ph)Br$ as arylpalladium(II) halide catalyst. Since the intermediate Pd(O) species could be intramolecularly transferred to the C—Br end group, the polymerization was supposed to proceed in a chain-growth procedure. In considering that the "living" end group could remain active before quenched, the polymer intermediate could act as "macro-initiator" to allow the formation of another block with the successive addition of monomers.[10]

BRIEF SUMMARY OF THE INVENTION

Figure 2:
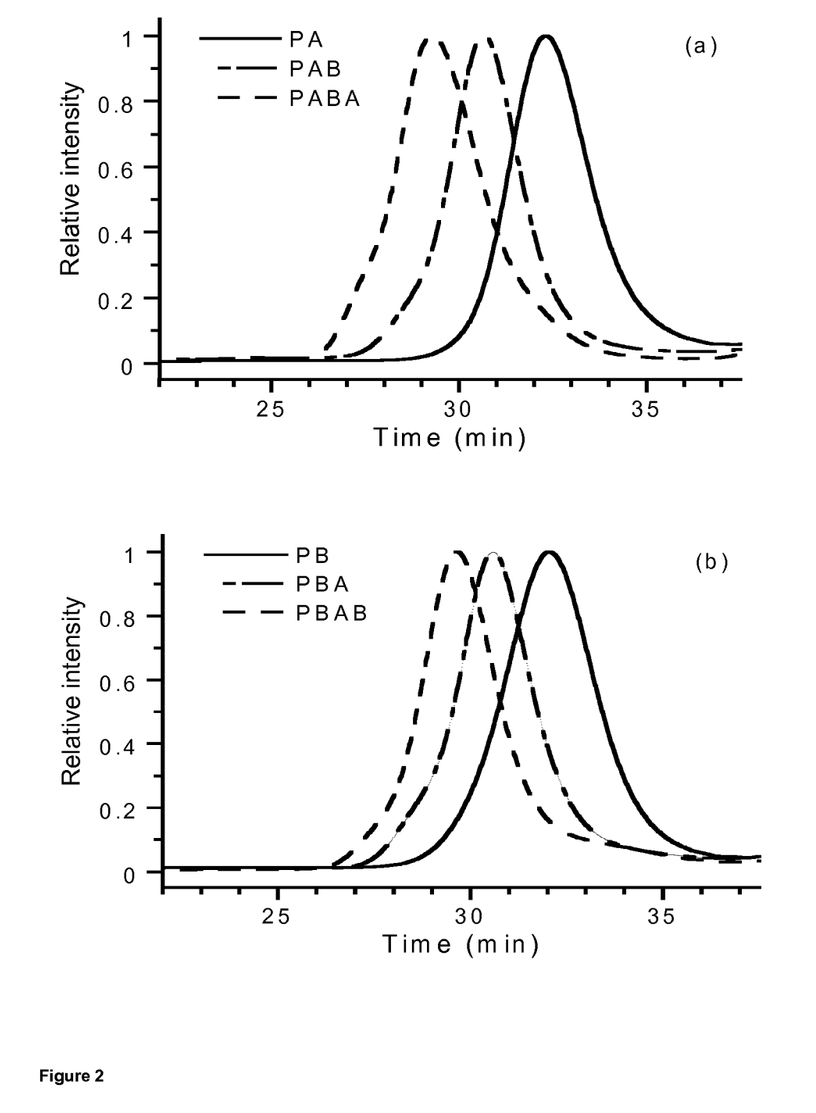
FIG. 2 shows GPC profiles of resulted homopolymer, di- and triblock copolymers. (a) Monomer addition order of MA, MB then MA with feed ratio of 1/1/1, PA ($M_n$=8.1 k, PDI=1.26), PAB ($M_n$=18.1 k, PDI=1.26) and PABA ($M_n$=27.2 k, PDI=1.43). (b) Monomer addition order of MB, MA and then MB with feed ratio of 1/1/1, PB ($M_n$=9.4 k, PDI=1.34), PBA ($M_n$=17.3 k, PDI=1.35) and PBAB ($M_n$=25.2 k, PDI=1.33).

The present invention overcomes the foregoing drawbacks. In contrast to the above-we describe synthesizing well-controlled neutral triblock all-conjugated copolymers by palladium-catalyzed chain-growth polymerization procedure, and moreover, quarternization of such triblock copolymers to produce all-conjugated triblock polyelectrolytes with well-controlled molecular weight and polydispersity. GPC data (shown in FIG. 2) indicated that the molecular weight of each block is between 8-9 k with PDI of 1.2-1.4, and the resulted all-conjugated triblock neutral precursors with Mn of 27.2 k and PDI of 1.43 for ABA, and Mn of 25.2 k and PDI of 1.33 for BAB, respectively. It should be noted that the molecular weight and PDI should be very similar to that the precursor during the quaternization procedures.

Neutral triblock all-conjugated polymers were produced by chain-growth polymerization with sequential monomer adding procedure, followed by post-polymerization quarternization of the neutral all-conjugated triblock precursors to produce all-conjugated amphiphilic triblock polyelectrolytes. The resulted triblock polyelectrolytes have immiscible hydrophilic and hydrophobic blocks.

All-conjugated triblock polyelectrolytes ABA-PyBr and BAB-PyBr were prepared by ionization of their neutral precursor, which were synthesized by chain-growth Suzuki-Miyaura coupling polymerization with controlled molecular weight and low polydispersity (PDI). Different morphology of films was found by spun-cast film from various ratios of THF/MeOH mixtures. The application of the triblock polyelectrolytes as interface could greatly improve the efficiency of polymer light-emitting diodes (PLEDs) to the same level with Ba/Al as cathode.

It is well-known that large-area ordered arrays in tens of nanometers are very favorable for the application of conjugated polymers in organic electronic devices, however, the preparation of large-area ordered arrays conjugated polymer films still remain as great challenge for conventional processing technologies. Block copolymers with immiscible blocks connected by covalent bond could allow for the phase-separation in tens of nanometers, which might be very effective way to control the self-assembly of the nanostructured film morphologies. The all-conjugated triblock polyelectrolytes reported herein are brand-new materials, and it could be used as superior electron injection layer in PLEDs with the self-assembled nanostructures with respect to the traditional random or alternative polyelectrolytes.

In one embodiment, a device is provided comprising an all-conjugated triblock polyelectrolyte.

In an embodiment of paragraph [0010], the polyelectrolyte has either of the two following structures:

where is selected from a group consisting of:

wherein $R_1$ and $R_2$ can be same or different and can be an alkyl chain —$C_nH_{(2n+1)}$, (n=1~30).

and is selected from a group consisting of wherein $R_3$ and $R_4$ can be independently a substituted alkyl chain of —$(CH_2)nR_5$, (n=1~30); wherein $R_5$ could be —$N^+(CH_3)_3F^-$, —$N^+(CH_3)_3Br_-$, —$N(CH_3)_3I^-$, —$N(C_2H_5)_3F^-$, —$N^+(C_2H_5)_3Br_-$, —$N^+(C_2H_5)_3I^-$, pyridine$^+Br^-$, and pyridine$^+I^-$;
and where x and y could be 6~50, more preferably 6~20.

In another embodiment of paragraph [0010], a device is provided in which the PDI range of the triblock is between 1.3-1.8, more preferably, 1.3-1.6; and/or the Mn range of the triblock polyelectrolytes are 3 kDa-150 kDa.

In yet another embodiment of paragraph [0010], the polyelectrolytes of the above device are made by quarternization of a neutral triblock all-conjugated polymer. In a more particularized embodiment, the triblock polyelectrolyte of the above device possesses amphiphilic properties.

In another embodiment of the invention, a composition is provided for an electron injection layer comprising an all-conjugated triblock polyelectrolyte. In yet more particularized embodiment, the Mn range of the triblock copolymer is 3 kDa~150 kDa and/or the PDI range of the triblock is between 1.3-1.8, more preferably, 1.3-1.6.

In yet another embodiment, a method of producing all-conjugated triblock copolymer is provided comprising performing a palladium-catalyzed chain-growth polymerization using fluorene monomers. In a more particularized embodiment, a method is provided wherein the triblock copolymers produced have a Mn range of between 3 kDa~150 kDa and/or wherein the triblock copolymers produced have a PDI range of between 1.3-1.8; more preferably, 1.3-1.6.

BRIEF DESCRIPTION OF THE DRAWINGS

For a more complete understanding of the present invention, reference is now made to the following descriptions taken in conjunction with the accompanying drawing, in which:

FIG. 1 shows a scheme for the production of the triblock polyfluorenes by quasi-"living" chain-growth procedure. FIG. 1 also shows some generic structures for ABA and BAB type triblock polyelectrolytes that can be made according to one embodiment.

DETAILED DESCRIPTION OF THE INVENTION

Chain-growth polymerization mechanism utilizing the sequential monomer adding procedure were utilized for the first time to prepare novel neutral triblock all-conjugated polymer precursors, and then these precursors were modified using post-polymerization procedures (namely, quarternization) to produce amphiphilic triblock polyelectrolytes in which each block shows distinctly different solubilities in MeOH/THF, or water/THF. These polyelectrolytes have a well defined molecular weight and narrow PDI range.

"Well defined molecular weight range" means herein that the molecular weight could be controlled by the ratios of monomers to the introduced initiator (catalyst), and the polydispersity of the resulted polymers should be much lower than the step-growth polymerization procedure, and the PDI herein should generally about 1.3-1.8, more preferably 1.3 to 1.6.

Figure 1:
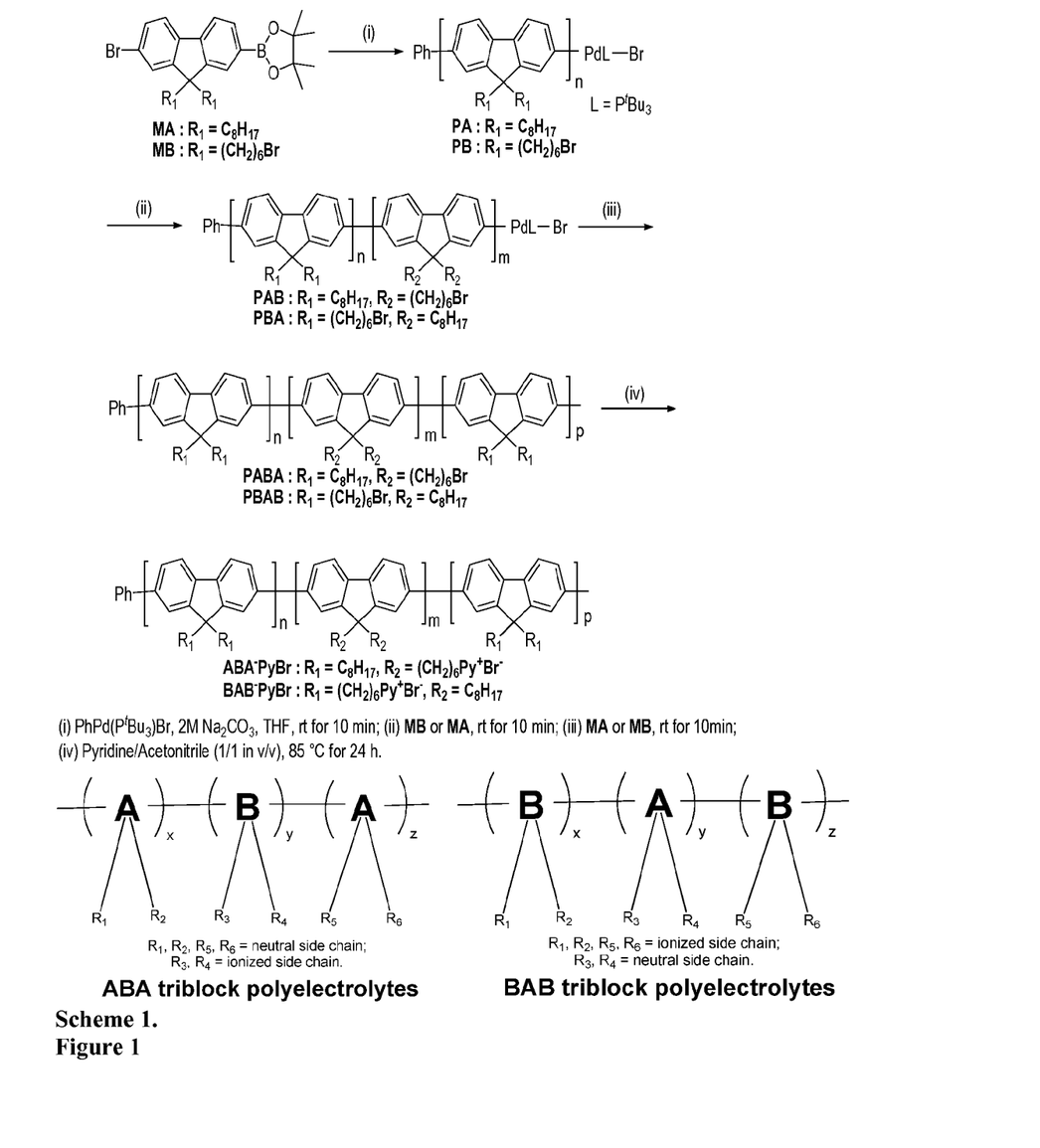

With the mind of sequential monomer adding procedure, we herein used two fluorene monomers (MA and MB) and demonstrated the synthesis of triblock polyfluorenes by quasi-"living" chain-growth procedure (See FIG. 1, Scheme 1), and ionization/quarternization of the neutral precursor to synthesize the triblock polyelectrolytes.

The molecular weight of the triblock polyelectrolytes produced by the disclosed process are in range of 9 kDa~60 kDa, with PDIs in range of 1.3-1.8, more preferably 1.3 to 1.6.

Figure 5:
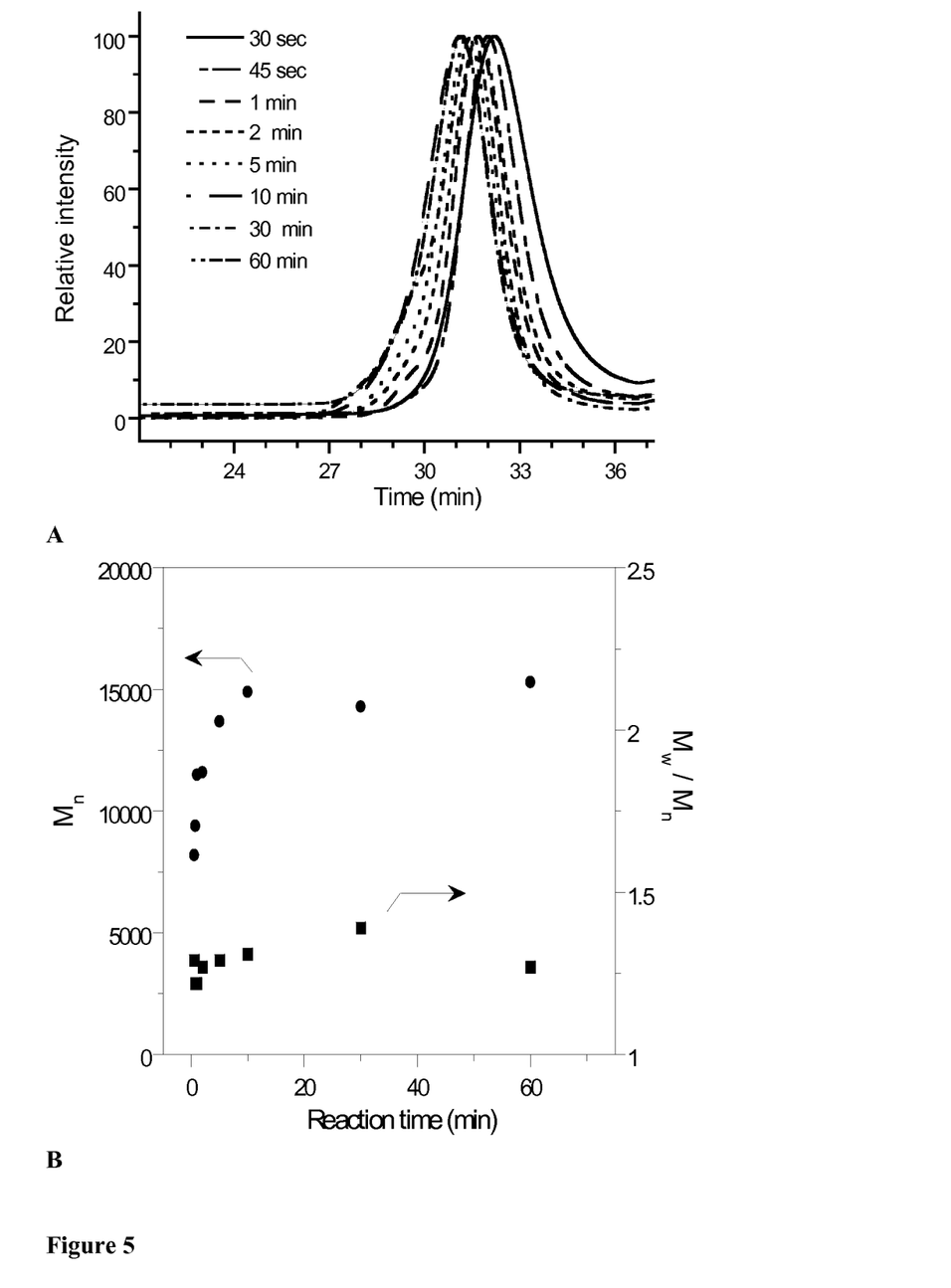
FIG. 5 shows a GPC profiles of the PA with different reaction time (a) and Mn and Mn/Mw (PDI) as a function of reaction time (b).
Figure 6:
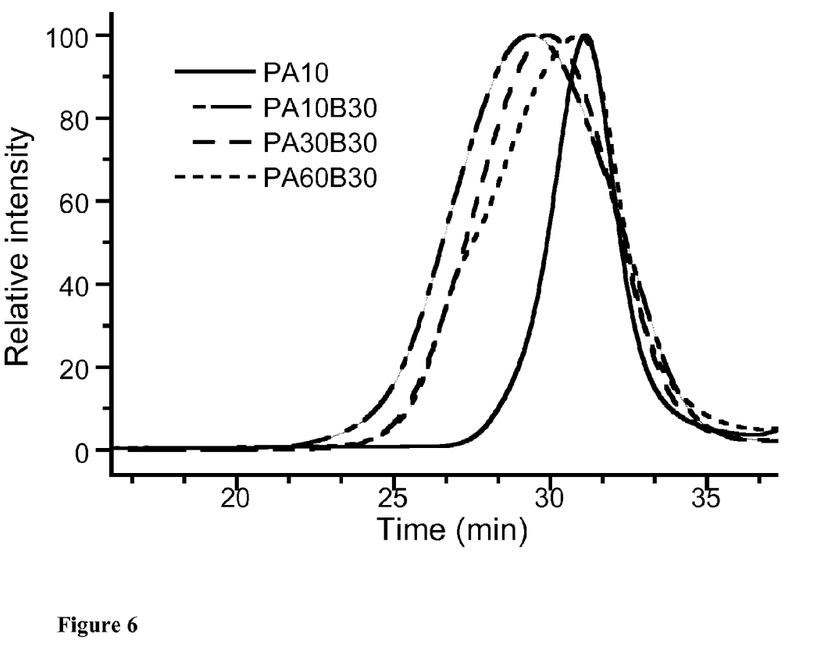
FIG. 6 shows a GPC profiles of homopolymer PA and diblock PAB.
Figure 7:
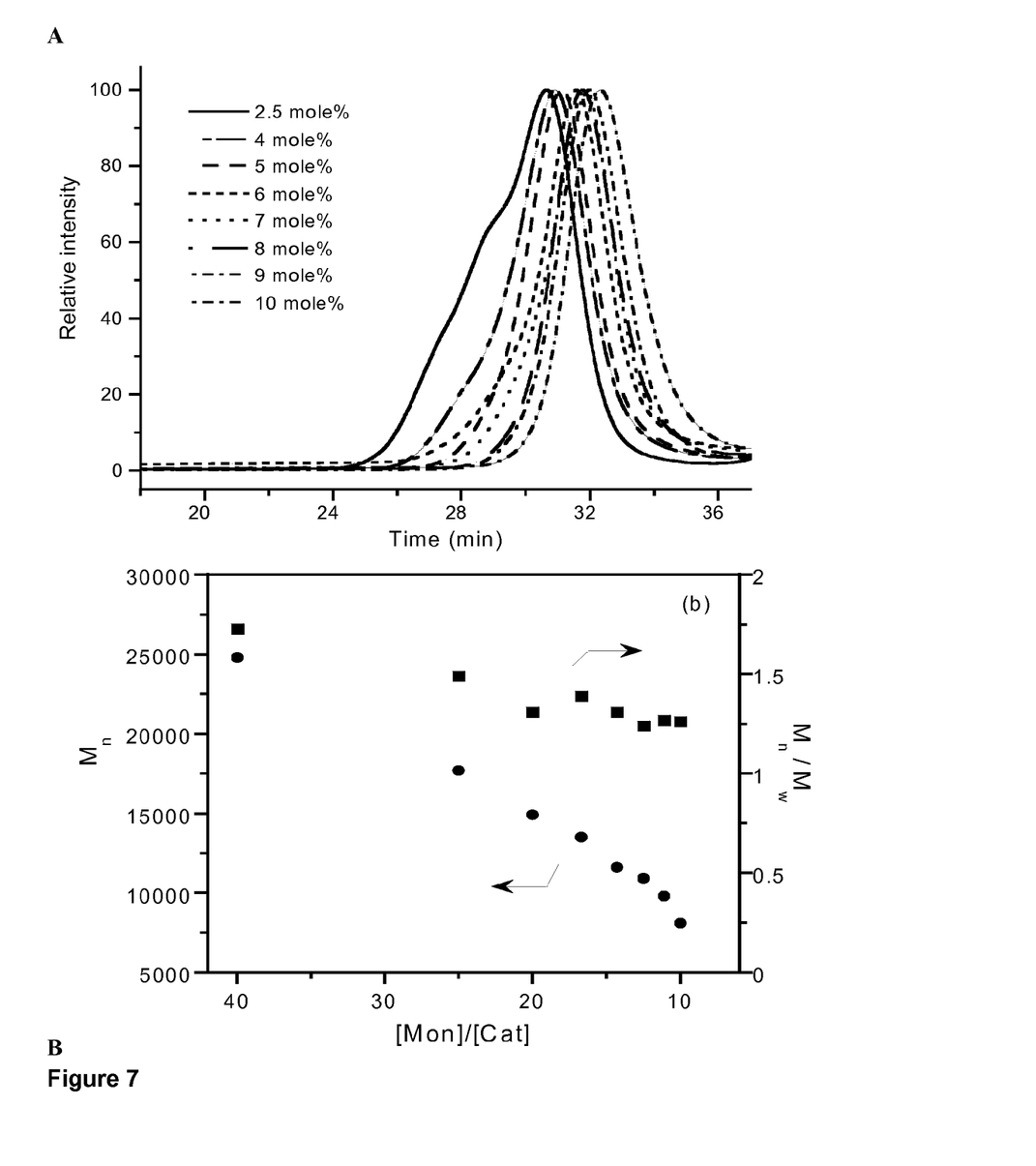
FIG. 7 shows a GPC profiles of the PA with different reaction time (a) and Mn and Mn/Mw (PDI) as a function of [MA]0/[cat]0 (b).

Since there is no difference in the functional group of MA and MB, the Mn and PDI of block copolymers would not be influenced by the sequence of monomer addition. Additionally, it should be noted that, in order to avoid the formation of random structure of the second block, the completely consumption of first monomer before the addition of the second monomer is very important. By following Yokozawa's procedure,[9] we found that the polymerization of monomer MA could be finished in 10 min with yield higher than 90% (FIG. 5). Thus the time interval of 10 min was chosen herein to minimize the probability of deactivation of "living" end groups. However, diblock PAB or PBA was afforded with PDI>2.0 even with this time interval, the reason might be attributed that the chain-growth is possibly terminated by the deactivation of the "living" end groups as evidenced by the GPC profiles (FIG. 6). To facilitate the chain-growth procedure, we tried to improve catalyst ratio to generate more macro-initiator for the chain-growth of the following blocks with slightly sacrifice the molecular weight. It was found that the Mn of the resulted polymer reduced gradually with [MA]$_0$/[cat]$_0$ decreased from 40 to 10, but their PDI remain at about 1.3 (FIG. 7). With the sequential monomer adding procedure, all-conjugated diblock PAB, PBA and triblock PABA and PBAB could be prepared with well-defined molecular weight and narrow PDI. To the best of our knowledge, this is the first report on synthesizing well-controlled all-conjugated triblock copolymers by palladium-catalyzed chain-growth polymerization procedure.

The bromo-ended alkyl side chain of block B allow for the ionization then leading to the triblock polyelectrolytes ABA-PyBr and BAB-PyBr. The content of ionization is actually higher than 95% since there are no distinct proton signal originated from —CH2—Br in their $^1$H NMR spectra. Also, BAB-NBr was made by quarternization of triblock copolymer with trimethyl amine to replace that of pyridine. The resultant triblock ABA-PyBr, BAB-PyBr and BAB-NBr exhibit reversed solubility with respect to their neutral precursor, the "neutral" block A was actually more soluble in THF while the "charged" block B was more soluble in MeOH, thus the resulted triblock copolymer was more favorable to soluble in THF/MeOH mixtures, that is to say that the resultant triblock polyelectrolyte possessed amphiphilic properties. Other solvent mixtures that could be used for triblock polyelectrolytes include, but are not limited to, THF/Water, dichloromethane/MeOH, and chloroform/MeOH.

Groups that can be used for quarternization of the neutral triblock all-conjugated polymer, other than pyridine include, but are not limited to: Me$_3$N, (Ethyl$_3$)N, (Propyl$_3$)N, (Me$_2$Ethyl)N, (MeEthyl$_2$)N, (Me$_2$Propyl)N, (MePropyl$_2$)N, or (Ethyl$_2$Propyl))N.

Figure 3:
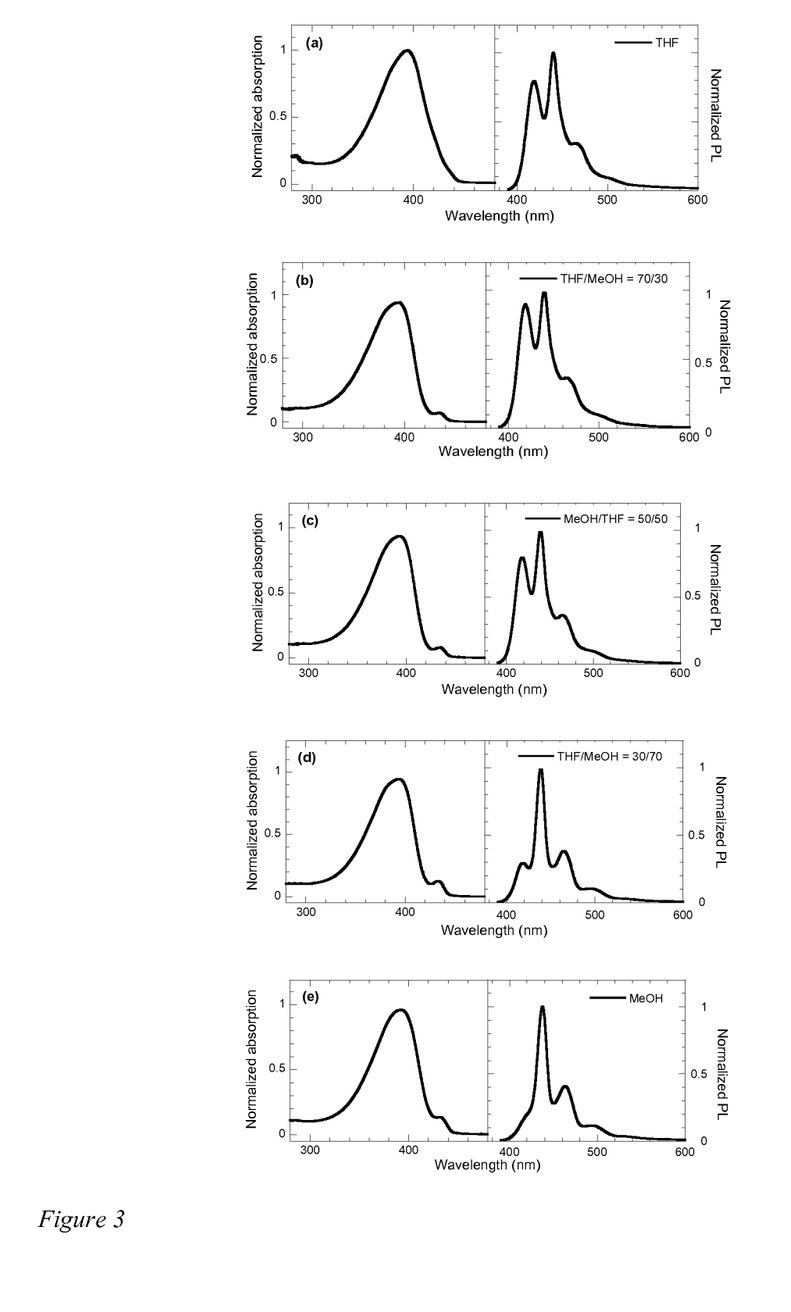
FIG. 3 shows UV-vis and PL spectra of ABA-PyBr in (a) THF, (b) THF/MeOH=50/50 (v/v) (c) MeOH/THF; (d) THF/MeOH 30/70; and (e) MeOH solution.
Figure 4:
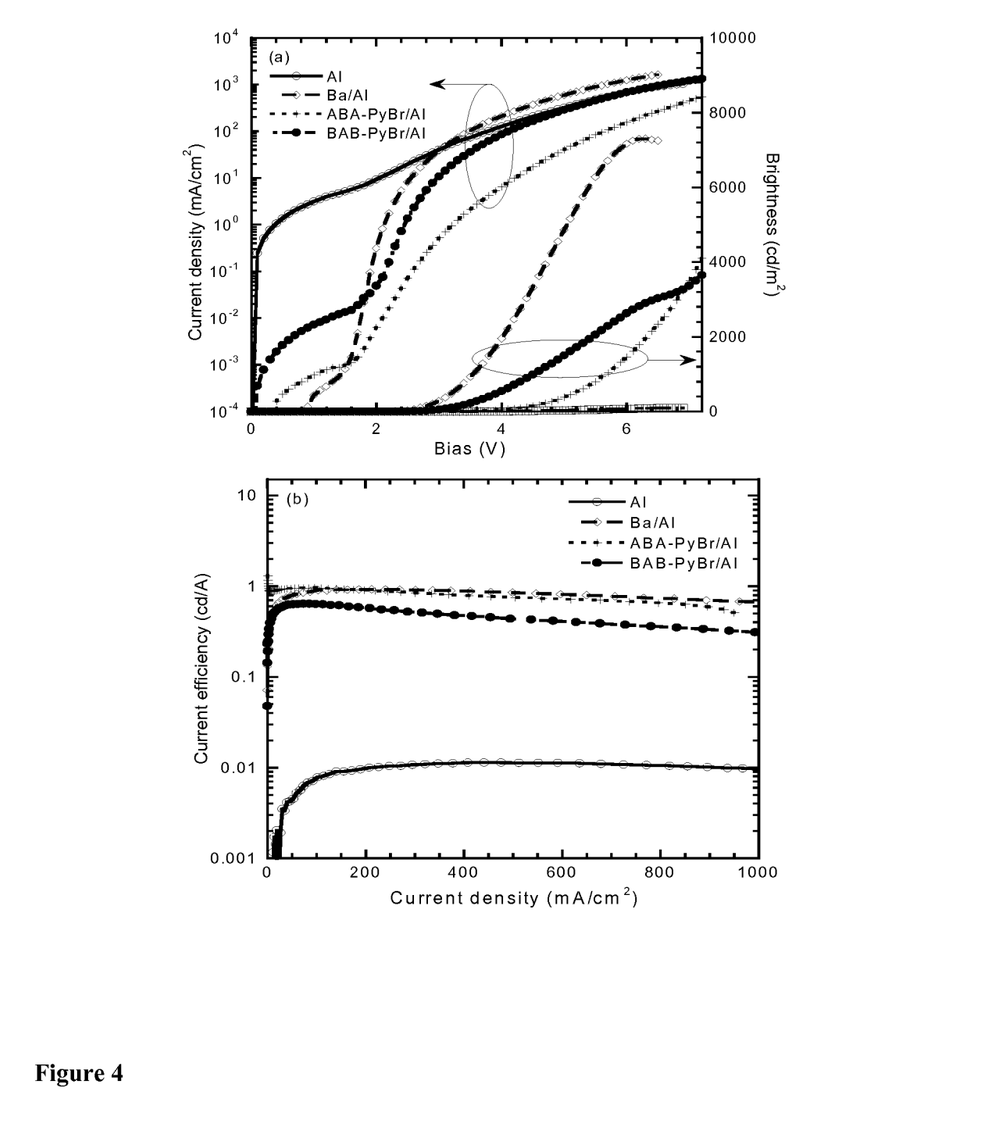
FIG. 4 shows current density-bias-brightness (J-V-L) (a) and current efficiency-current density (LE-J) characteristics (b) of devices with structure of devices with structure of ITO/PEDOT:PSS/MEH-PPV/cathode.
Figure 8:
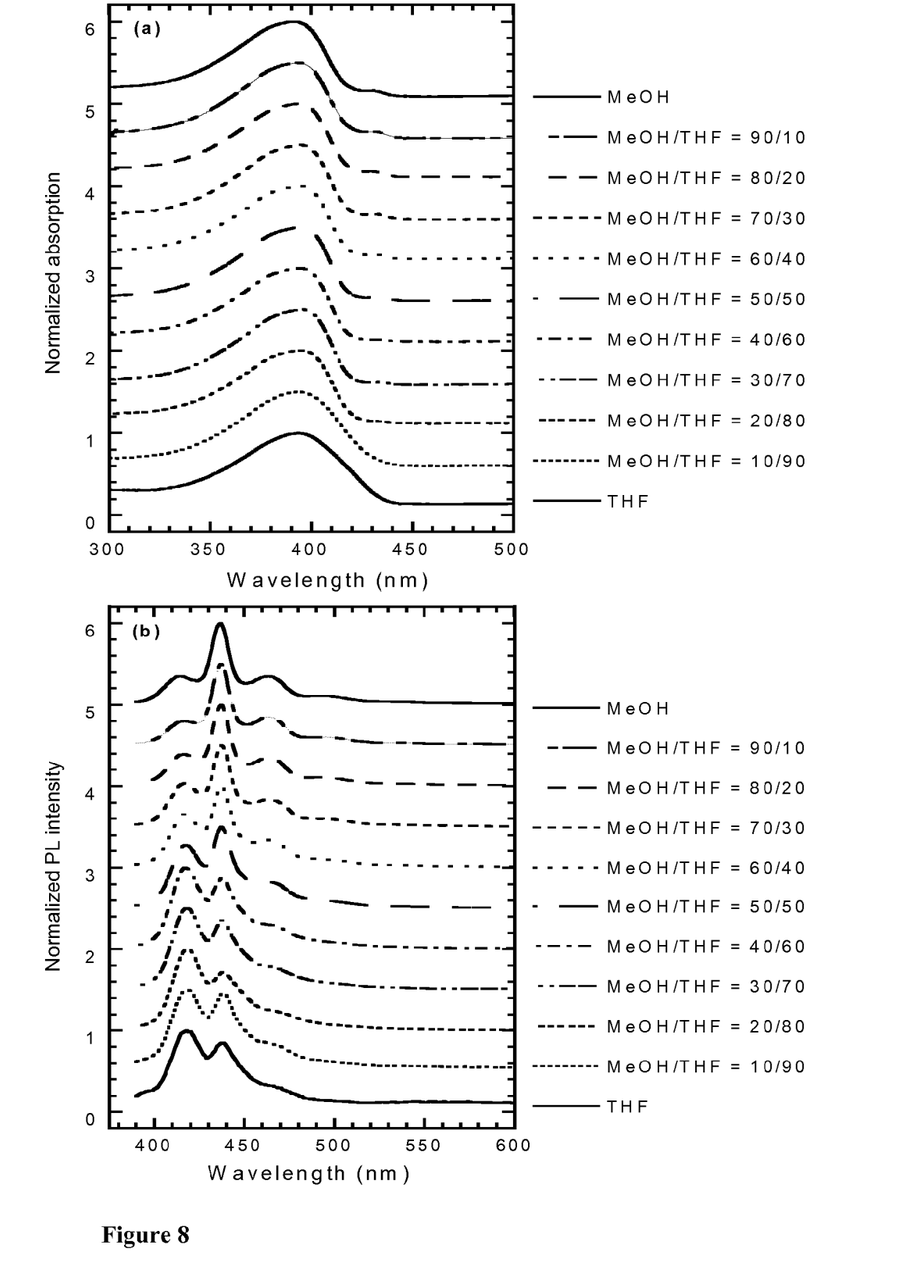
FIG. 8 shows a UV-vis and PL spectra of BAB-PyBr in THF/MeOH mixtures with different ratios.

In considering that the rod block backbone contains two blocks with immiscible side chains, there should be special self-assembled nano-structures formed in different solutions, thus their photophysical properties of the copolymers would be changed with different solvent polarity. With the improvement of the methanol content, the comparative intensity of the peak at 422 nm (0-0 band) decreases while the peak at about 430 nm in UV-vis spectra increase gradually (FIG. 3a-e), the PL spectrum with MeOH solution exhibit distinct beta-phase with three characteristic peaks at 439 nm (0-0 band), 467 nm (0-1 band) and 496 nm (0-2 band)[11] (FIG. 3e). Similar photophysical results were attained on investigation BAB-PyBr solution as shown in FIG. 8.

To inspect the function of the resulted triblock polyelectrolytes as the electron injection layer in multilayer PLEDs, devices are fabricated with structure of ITO/PEDOT:PSS/MEH-PPV/cathode. It was found that the current the device performances with triblock CPEs as interfaced were obviously improved with respect to devices with Al as cathode, and is very close to that of with Ba/Al as cathode. The threshold voltage for ABA-PyBr/Al and BAB-PyBr/Al as the cathode devices are as low as 2.1 and 2.4 V, respectively, which was very close to that of 2.1 V with Ba/Al as cathode. The maximal current efficiency (LE) and maximal brightness (Bmax) for devices with ABA-PyBr as interface achieved 0.92 cd/A (4.0 V) and 7248 cd/m$^2$, respectively, which was very close to the device with LE of 0.98 (3.9 V) and B$_{max}$ of 7951 cd/m$^2$ with Ba/Al as cathode. However, slightly lower LE of 0.64 cd/A (3.9 V) with B$_{max}$ of 4581 cd/m$^2$ was acquired for device with BAB-PyBr as interfaces. The distinctly improved device performances might be originated from the lowered electron injection barrier from the high work function cathode Al, indicating that the inserted triblock polyelectrolytes could be use as effective electron injection layer in fabrication of multi-layer PLEDs.[12] Moreover, it should be noted that this performance is achieved by Br– as counter ion, the device efficiency could be further improved by ion exchange with other counter ions like tetrakis(1-imidazolyl) borate (BIm$_4$).[2c] Further improvement of the device efficiency might be able to achieve by controlling the film thickness or annealing procedures, this part of work was still in progress.

Other possible counter ions that could be used for ion exchange instead of Br– are, but not limited to: F, Cl, I, CF$_3$SO$_3$, BIm$_4$, BArF$_4$, BF$_4$, PF$_6$, F$_3$CSO$_3$, BPh$_4$, BPhF$_4$, or HPO$_4^{2-}$.

Figure 9:
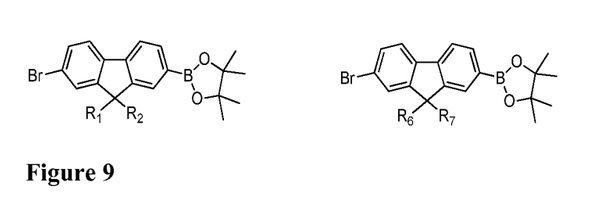
FIG. 9 shows the different fluorene monomers that can be utilized in one embodiment of the process.
Figure 10:
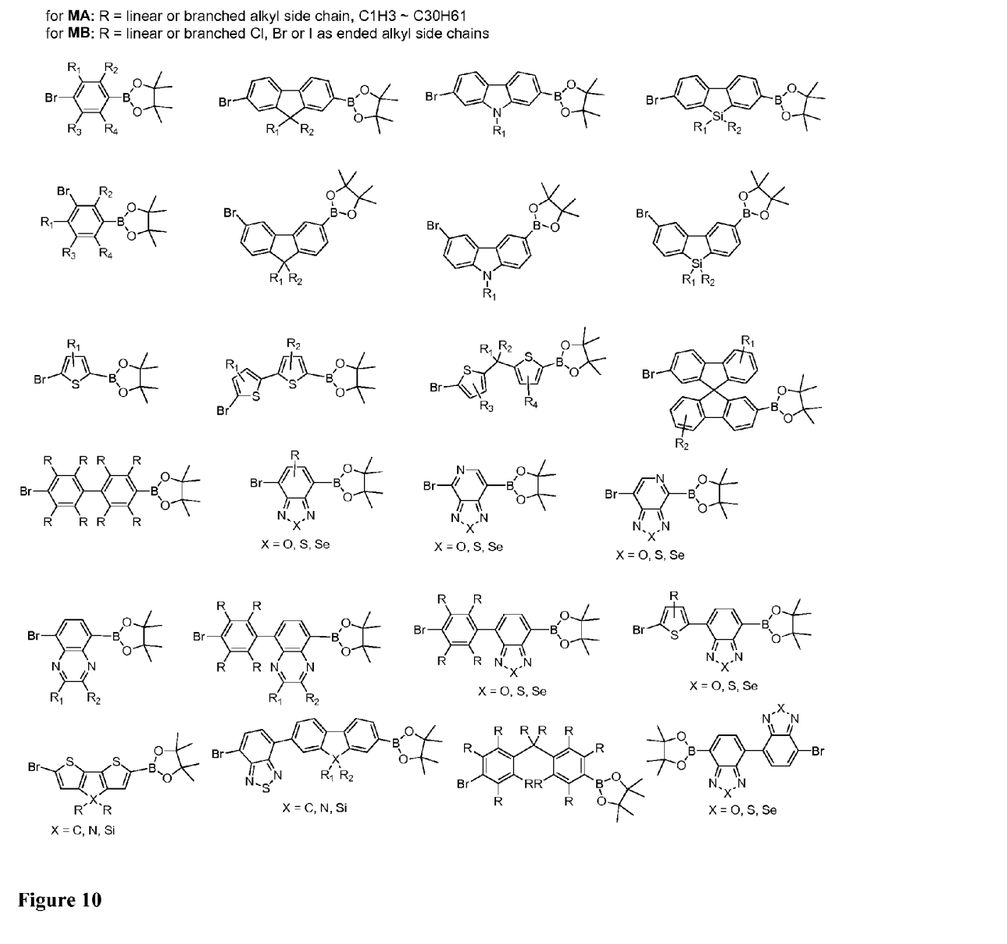
FIG. 10 shows other fluorene monomers that can be utilized in other embodiments of the process.

Other possible compounds that could be used to produce the triblock polyelectrolytes instead of MA and MB are described in FIG. 9.

Although a device is shown utilizing the triblock polyelectrolytes as an electron injection layer, it is possible that such compounds will also be effective as effective hole injection layer (HIL) in PLEDs.

In conclusion, all-conjugated triblock copolymers with controlled molecular weight and narrow polydispersity were synthesized by Suzuki-Miyaura reaction with sequential monomer adding procedure. AFM images indicated the regional ordered film morphology could be formed by the ionized triblock copolymer solution. The photophysical properties of ionized triblock copolymer relied on the ratio of tetrahydrofuran and methanol. With the application of the resulted all-conjugated triblock polyelectrolytes as interface in PLEDs with high work function Al as cathode, the device efficiency could achieve the same level of the device with Ba/Al as cathode.

The all-conjugated triblock polyelectrolytes reported herein are brand-new materials, and it could be used as superior electron injection layer in PLEDs with the self-assembled nanostructures with respect to the traditional random or alternative polyelectrolytes with random or alternative backbone structure. These same triblock polyelectrolytes materials may also be useful for organic light emitting devices (OLEDs), field-effect transistors (FETs), organic photovoltaics (OPVs) and biosensors.

Experimental Section

Synthesis of 2-(7-bromo-9,9-dioctyl-9H-fluoren-2-yl)-4,4,5,5-tetramethyl-1,3,2-dioxaborolane (MA)

2,7-Dibromo-9,9-dioctylfluorene (2.00 g, 3.65 mmol, 1 eq.) was dissolved in diethyl ether (30 ml). The solution was cooled to –78° C. and n-butyllithium (2.4 mL of a 1.6 M solution in hexanes, 3.83 mmol, 1.1 eq.) was added drop wise with strong stirring. The resulted white suspension was allowed to warm to –10° C. until a clear-yellow solution 3 was formed. After stirring for another 10 min, the solution was cooled to –78° C. again and 2-isopropoxy-4,4,5,5-tetramethyl-1,3,2-dioxaborolane (0.82 mL, 4.0 mmol, 1.1 eq.) was added in one time. The mixture was stirring for another 1 h at –78° C. and was allowed to warm to 25° C. and stirred for 24 h, and then the reaction was quenched by 10 mL of water. The organic layer was washed thoroughly by water and was dried by anhydrous Na2SO4. After the solvent was removed under reduced pressure, the crude oil was separated by column chromatography with hexane/dichloromethane=4/1 (v/v) as eluent to give 1.42 g of white powder (yield=65%). 1H NMR (500 MHz, CDCl3) δ (ppm): 7.80 (d, J=7.55 Hz, 1H), 7.72 (s, 1H), 7.65 (d, J=7.55 Hz, 1H), 7.57 (d, J=7.80 Hz, 1H), 7.44 (m, 2H), 2.02-1.96 (m, 2H), 1.94-1.88 (m, 2H), 1.39 (s, 12H), 1.23-1.14 (m, 4H), 1.13-1.03 (m, 16H), 0.82 (t, J=7.15 Hz, 6H), 0.57 (m, 4H). 13C NMR (500 MHz, CDCl3) δ (ppm):

153.57, 149.50, 142.98, 139.97, 133.88, 129.89, 128.86, 126.23, 121.52, 121.44, 119.02, 83.78, 55.47, 53.41, 40.12, 31.77, 29.21, 29.18, 24.97, 23.61, 22.59, 14.06.

Synthesis of 2-(7-bromo-9,9-bis(6-bromohexyl)-9H-fluoren-2-yl)-4,4,5,5-tetramethyl-1,3,2-dioxaborolane (MB)

2,7-Dibromo-9,9-bis(6-bromohexyl)fluorene (2.00 g, 3.08 mmol, 1 eq.) was dissolved in diethyl ether (25 ml). The solution was cooled to −78° C. and t-butyllithium (2.0 mL of a 1.7 mole/L solution in hexanes, 3.38 mmol, 1.1 eq.) was added drop wise with strong stirring. The resulted white suspension was allowed to warm to −10° C. and stirred for 10 min. Then the solution was cooled to −78° C. again and 2-isopropoxy-4,4,5,5-tetramethyl-1,3,2-dioxaborolane (0.69 mL, 3.38 mmol, 1.1 eq.) was added in one time. The mixture was stirring for another 1 h at −78° C. and was allowed to warm to 25° C. and stirred for 24 h, and then the reaction was quenched by 10 mL of water. The organic layer was washed thoroughly by water and was dried by anhydrous Na2SO4. After the solvent was removed under reduced pressure, the crude oil was separated by column chromatography with hexane/chloroform=3/1 (v/v) as eluent to give 1.18 g of white powder (yield=50%). 1H NMR (500 MHz, CDCl3) δ (ppm): 7.81 (d, J=7.55 Hz, 1H), 7.72 (s, 1H), 7.66 (d, J=7.55 Hz, 1H), 7.58 (dd, J=1.90 and 6.70 Hz, 1H), 7.46 (dd, J=1.80 and 6.70 Hz), 3.27 (t, J=6.85 Hz, 4H), 2.03-1.95 (m, 2H), 1.94-1.91 (m, 2H), 1.67-1.62 (m, 4H), 1.39 (s, 12H), 1.19-1.14 (m, 4H), 1.09-1.04 (m, 4H), 0.61-0.55 (m, 4H). 13C NMR (500 MHz, CDCl3) δ (ppm): 153.19, 149.12, 142.97, 139.98, 134.06, 130.09, 128.75, 126.14, 121.64, 121.56, 119.14, 83.85, 55.35, 40.00, 33.88, 32.65, 28.97, 27.76, 24.98, 23.44.

Synthesis of all-Conjugated Triblock Copolymer PABA

In a 50 mL of one-neck round-bottom flask, 2-(7-bromo-9,9-dioctyl-9H-fluoren-2-yl)-4,4,5,5-tetramethyl-1,3,2-dioxaborolane (MA) (100 mg, 0.168 mmol, 1 eq.) was placed and vacuum was applied, which was then filled by argon. Then absolute THF (8 mL) and 2 mole/L aqueous solution of Na2CO3 (5 mL) were added, and the mixture was stirred at room temperature. The polymerization was initiated by adding a solution of tBu3PPd(Ph)Br (7.8 mg, 0.0168 mmol, 0.1 eq.) in THF (2 mL). After 10 min, the second monomer 2-(7-bromo-9,9-bis(6-bromohexyl)-9H-fluoren-2-yl)-4,4,5,5-tetramethyl-1,3,2-dioxabor-olane (MB) (117 mg, 0.168 mmol, 1 eq.) was added and the reaction was allowed to stirring for another 10 min. To form the third block, MA (100 mg, 0.168 mmol, 1 eq.) was added and the reaction was allowed to react for another 10 min. The organic phase was separated and poured into a mixture of 2 mole/L hydrochloric acid (50 mL) and methanol (200 mL) with stirring. The precipitate was collected by centrifuging, washed thoroughly with water and extracted with chloroform, and dried under reduced pressure overnight to give resulted as yellow powder. 1H NMR (500 MHz, CDCl3) δ (ppm): 7.85 (m, 6H), 7.68 (m, 12H), 3.30 (t, J=6.75 Hz, 4H), 2.13 (br s, 12H), 1.71 (s, 4H), 1.35-1.05 (m, 60H), 0.83 (m, 12H).

Synthesis of All-Conjugated Triblock PBAB

The synthesis of PBAB was performed in the similar procedure with that of PABA, the only difference is the monomer addition order is MB/MA/MB. 1H NMR (500 MHz, CDCl3) δ (ppm): 7.85 (m, 6H), 7.71 (m, 12H), 3.30 (t, J=6.70 Hz, 8H), 2.15 (br s, 12H), 1.70 (m, 8H), 1.35-1.05 (m, 40H), 0.83 (m, 14H).

Ionization/Quarternization

The triblock copolymer precursors PABA and PBAB was ionized by pyridine in similar procedure, take PABA for example. PABA (100 mg, 1 eq.) was dissolved in chloroform (15 mL). Acetonitrile (10 mL) and pyridine (5.25 mL, 67.5 mmole, 50 eq.) was added to solution and the mixture was stirred and refluxed for 24 h. When a yellow precipitate appeared (after 2 h), another portion of acetonitrile (5 mL) was added to redissolve the solid. Solvents and excess pyridine were removed by distillation under reduced pressure. The resulted brownish yellow powder was collected and dried at 50° C. under vacuum overnight.

Fabrication of Polymer Light-Emitting Diodes (PLEDs)

The resulted triblock polyelctrolytes (ABA-PyBr or BAB-PyBr) were dissolved in MeOH (or MeOH containing 30 v/v % or less THF) and filtered with a 0.45 μm PTFE filter, respectively. Patterned ITO coated glass substrates were cleaned with acetone, detergent, distilled water and 2-propanol followed by in an ultrasonic bath. After treated with oxygen plasma, 50 nm of poly(3,4-ethylenedioxythiophene) doped with poly(styrenesulfonic acid) (PEDOT:PSS, Batron-P 4083, Bayer AG) was spin-coated onto the cleaned ITO substrates followed by drying in a vacuum oven at 80° C. for 8 h. A thin film of polymers was coated onto the PEDOT:PSS layer by spin-casting inside a glove box. The film thickness of the active layers was around 75-80 nm, determined by an Alfa Step 500 surface profiler (Tencor). A thin layer of Ba (4-5 nm) and Al (100-120 nm) were thermally evaporated on the top of an EL polymer layer at a base pressure of $1\times10^{-4}$ Pa. Current-Luminance-Voltage (1-L-V) characteristics of the devices was recorded with a calibrated Si photodiodes and a Keithley 236 source-measurement unit. Moreover, the luminance was calibrated by a PR 705 photometer (Photo Research).

FIG. 5 described in more detail is a GPC profiles of the PA with different reaction time (a) and $M_n$ and $M_n/M_w$ (PDI) as a function of reaction time (b). All the polymerizations were performed in THF/Na2CO3 (2 mole/L) solution at 25° C. with $[MA]_0/[cat]_0$ of 20. $M_n$ and $M_w/M_n$ values were determined by GPC with THF as eluent and polystyrene as reference. $M_n$ and PDI of polymer with reaction time of 0.5 min: $M_n$=8.2 k, PDI=1.29 with yield of 62%; 0.75 min: $M_n$=9.4 k, PDI=1.22 with yield of 71%; 1 min: $M_n$=11.5 k, PDI=1.22 with yield of 79%; 2 min: $M_n$=11.6 k, PDI=1.27 with yield of 86%; 5 min: $M_n$=13.7 k, PDI=1.29 with yield of 88%; 10 min: $M_n$=14.9 k, PDI=1.31 with yield of 90%; 30 min: $M_n$=14.3 k, PDI=1.39 with yield of 91%; 60 min: $M_n$=15.3 k, PDI=1.27 with yield of 95%.

FIG. 6 described in more detail is a GPC profiles of homopolymer PA and diblock PAB. All the polymerization were performed in THF/Na2CO3 (2 mole/L) solution at 25° C. $[MA]_0/[cat]_0$ of 20. $M_n$ values were determined by GPC with THF as eluent and polystyrene as reference. PA10 were quenched after 10 min of intiation, and $M_n$ and PDI of PA10: $M_n$=14.9 k, PDI=1.31. Diblock copolymers PAB were synthesized with monomer addition order of MA and then MB and feed ratio of MA/MB of 1/1, PA10B30 (10 min for reaction of MA and then 30 min of MB) with $M_n$=22.3 k, PDI=2.96; PA30B30 (30 min for reaction of MA and then 30 min of MB) with $M_n$=22.2 k, PDI=2.12; PA60B30 (60 min for reaction of MA and then 30 min of MB) with $M_n$=19.8 k, PDI=2.17.

FIG. 7 described in more detail is a GPC profiles of the PA with different reaction time (a) and $M_n$ and $M_n/M_w$ (PDI) as a function of $[MA]_0/[cat]_0$ (b). All the polymerizations were performed in THF/Na2CO3 (2 mole/L) solution at 25° C. with reaction time of 10 min. $M_n$ and $M_w/M_n$ values were determined by GPC with THF as eluent and polystyrene as reference. $M_n$ and PDI of polymer with $[MA]_0/[cat]_0$ of 40: $M_n$=24.8 k, PDI=1.73 with yield of 86%; 25: $M_n$=17.7 k, PDI=1.49 with yield of 82%; 20: $M_n$=14.9 k, PDI=1.31 with yield of 90%; 16.7: $M_n$=13.5 k, PDI=1.39 with yield of 87%; 14.3: $M_n$=11.6 k, PDI=1.31 with yield of 91%; 12.5: $M_n$=10.9 k, PDI=1.24 with yield of 90%; 11.1: $M_n$=9.8 k, PDI=1.27 with yield of 88%; 10: $M_n$=8.1 k, PDI=1.26 with yield of 92%.

In one embodiment, the synthesis of triblock polyelectrolytes can occur in the following two steps:
STEP 1) (MA+MB+MA)→(triblock polymer precursor);
STEP 2) (triblock polymer precursor)→(triblock polymer electrolytes).

In step 1), the monomer can be monomer A (MA), and monomer B (MB). The triblock precursors structures formed from such can be be (polymer A)-block-(polymer B)-block-(polymer A); or it could be (polymer B)-block-(polymer A)-block-(polymer B). The triblock precursors have the same side chain as monomers.

In step 2), the triblock polymer electrolytes are formed as a result of the side group in (polymer B) being ionized. And it should be noted that, after ionization, only the side chain in (polymer B) was changed; but the side chain in (polymer A) was not changed.

Therefore, the side chain for (polymer B) of the ionized triblock polyeletrolytes can be charged groups. However, the side chain for (polymer A) is the same as the monomer.

REFERENCES—WHICH ARE ALL HEREIN
INCORPORATED BY REFERENCE IN THEIR
ENTIRETY 1. (a) Huang, F.; Wu, H. B.; Cao, Y. Chem. Soc. Rev. 2010, 39, 2500-2521. (b) Hoven, C. V., Garcia, A., Bazan, G. C. and Nguyen, T. Q. Adv. Mater. 2008, 20, 3793-3810 (c) Feng, X. L.; Li, L. B.; Wang, S.; Zhu, D. B. Chem. Soc. Rev. 2010, 39, 2411-2419. (d) Liu, B. and Bazan, G. C. Chem. Mater. 2004, 16, 4467-4476.
2. (a) Huang, F., Wu, H., Wang, D., Yang, W. and Cao, Y. Chem. Mater. 2004, 16, 708-716. (b) Huang, F., Hou, L., Wu, H., Wang, X, Shen, H., Cao, W., Yang, W. and Cao, Y. J. Am. Chem. Soc. 2004, 126, 9845-9853. (c) Yang, R. Q., Wu, H. B., Cao, Y. and Bazan, G. C. J. Am. Chem. Soc. 2006, 128, 14422-14423. (d) Yang, R., Garcia, A., Korystov, D., Mikhailovsky, A., Bazan, G. C. and Nguyen, T.-Q. J. Am. Chem. Soc. 2006, 128, 16532-16539. (e) Pu, K. Y.; Cai, L. P.; Liu, B. Macromolecules 2009, 42, 5933-5940.
3. (a) Tu, G. L.; Li, H. B.; Forster, M.; Heiderhoff, R.; Balk, L. J.; Scherf, U. Macromolecules 2006, 39, 4327-4331. (b) Scherf, U.; Gutacker, A.; Koenen, N. Acc. Chem. Res. 2008, 41, 1086-1097. (c) Tu, G. L.; Li, H. B.; Forster, M.; Heiderhoff, R.; Balk, L. J.; Sigel, R.; Scherf, U. Small 2007, 3, 1001-1006. (d) Gutacker, A.; Adamczyk, S.; Helfer, A.; Garner, L. E.; Evans, R. C.; Fonseca, S. M.; Knaapila M.; Bazan, G. C.; Burrows, H. D.; Scherf, U. J. Mater. Chem. 2010, 20, 8, 1423-1430.
4. (a) Miyakoshi, R.; Yokoyama, A.; Yokozawa, T. J. Am. Chem. Soc. 2005, 127, 17542-17547. (b) Iovu, M. C.; Sheina, E. E.; Gil, R. R.; McCullough, R. D. Macromolecules 2005, 38, 8649-8656.
5. (a) Miyakoshi, R.; Shimono, K.; Yokoyama, A.; Yokozawa, T. J. Am. Chem. Soc. 2006, 128, 16012-16013.
6. (a) Stefan, M. C.; Javier, A. E.; Osaka, I.; McCullough, R. D. Macromolecules 2009, 42, 30-32. (b) Yokoyama, A.; Kato, A.; Miyakoshi, R.; Yokozawa, T. Macromolecules 2008, 41, 7271-7273.
7. (a) Miyakoshi, R.; Yokoyama, A.; Yokozawa, T. Chem. Lett. 2008, 37, 1022-1023. (b) Javier, A. E.; Varshney, S. R.; McCullough, R. D. Macromolecules 2010, 43, 3233-3237. (c) Wu, S. P.; Bu, L. J.; Huang, L.; Yu, X. H., Han, Y. C., Geng, Y. H., and Wang, F. S. Polymer 2009, 50, 6245-6251. (d) Wu, S. P.; Sun, Y. Q.; Huang, L.; Wang, J. W.; Zhou, Y. H.; Geng, Y. H.; Wang, F. S. Macromolecules 2010, 43, 4438-4440. (e) Ohshimizu, K.; Ueda, M. Macromolecules 2008, 41, 5289-5294. (f) Zhang, Y.; Tajima, K.; Hirota, K.; Hashimoto, K. J. Am. Chem. Soc. 2008, 130, 7812-7813.
8. Huang, L.; Wu, S. P.; Qu, Y.; Geng, Y. H.; Wang, F. S. Macromolecules 2008, 41, 8944-8947.
9. Yokoyama, A.; Suzuki, H.; Kubota, Y.; Ohuchi, K.; Higashimura, H.; Yokozawa, T. J. Am. Chem. Soc. 2007, 129, 7236-7237.
10. Yokozawa, T.; Kohno, H.; Ohta, Y.; Yohouyama A. Macromolecules 2010, 43, 7095-7100.
11. (a) Lu, H. H.; Liu, C. Y.; Chang, C. H.; Chen, S. A Adv. Mater. 2007, 19, 2574-2579. (b) Ariu, M.; Sims, M.; Rahn, M. D.; Hill, J.; Fox, A. M.; Lidzey, D. G. Phys. Rev. B 2003, 67, 195333.
12. Wu, H., Huang, F., Mo, Y., Yang, W., Wang, D., Peng, J. and Cao, Y. Adv. Mater. 2004, 16, 1826-1830.

Although the present invention has been described in connection with the preferred embodiments, it is to be understood that modifications and variations may be utilized without departing from the principles and scope of the invention, as those skilled in the art will readily understand. Accordingly, such modifications may be practiced within the scope of the following claims.

The invention claimed is:
1. A device comprising an all-conjugated triblock polyelectrolyte, wherein the polyelectrolyte has either of the two following structures:

where is selected from a group consisting of:

wherein $R_1$ and $R_2$ are the same or different and are alkyl chains $-C_nH_{(2n+1)}$, (n=1-30); and is selected from a group consisting of:

wherein $R_3$ and $R_4$ are independently a substituted alkyl chain of $-(CH_2)nR_5$, (n=1-30); wherein $R_5$ is $-N^+(CH_3)_3F^-$, $-N^+(CH_3)_3Br^-$, $-N^+(CH_3)_3I^-$, $-N^+(C_2H_5)_3F^-$, $-N^+(C_2H_5)_3Br^-$, $-N^+(C_2H_5)_3I^-$, pyridine $^+Br^-$ or pyridine $^+I^-$;
where x and y is 6-50.
2. The device of claim 1 in which the polydispersity index range of the triblock polyelectrolyte is between 1.3 and 1.8.

3. The device of claim 1, in which the number average molecular weight range of the triblock polyelectrolytes is between 3 kDa to 150 kDa.

4. The device of claim 1, wherein the triblock polyelectrolyte comprises an electron injection layer.

5. The device of claim 1, wherein the triblock polyelectrolyte is made by quarternization of a neutral triblock all-conjugated polymer.

6. The device of claim 1 in which the triblock polyelectrolyte possesses amphiphilic properties.

7. The device of claim 1, wherein the device is selected from the group consisting of polymeric light emitting diodes, organic light emitting diodes, field transistor devices, organic photovoltaic materials, and biosensors.

8. A composition for an electron injection layer comprising an all-conjugated triblock polyelectrolyte, wherein the polyelectrolyte has either of the two following structures:

where is selected from a group consisting of:

wherein $R_1$ and $R_2$ are the same or different and are alkyl chains $-C_nH_{(2n+1)}$, (n=1-30); and is selected from a group consisting of:

wherein $R_3$ and $R_4$ are independently a substituted alkyl chain of $-(CH_2)nR_5$, (n=1-30); wherein $R_5$ is $-N^+(CH_3)_3F^-$, $-N^+(CH_3)_3Br^-$, $-N^+(CH_3)_3I^-$, $-N^+(C_2H_5)_3F^-$, $-N^+(C_2H_5)_3Br^-$, $-N^+(C_2H_5)_3I^-$, pyridine $^+Br^-$ or pyridine $^+I^-$;

where x and y is 6-50.

9. The composition of claim 8 in which the number average molecular weight range of the triblock polyelectrolyte is between 3 kDa and 150 kDa.

10. The composition of claim 8 in which the polydispersity index range of the triblock polyelectrolyte is between 1.3 and 1.8.

11. The composition of claim 10, wherein a triblock polymer precursor is first made and then the precursor converted into the triblock polyelectrolyte.

12. The composition of claim 11, wherein the triblock polymer precursor is made by performing a palladium-catalyzed chain-growth polymerization using fluorene monomers A and B, wherein the fluorene monomer A is wherein $R_1$ and $R_2$ are the same or different and are alkyl chains $-C_nH_{(2n+1)}$, (n=1-30);

and monomer B is:

where $R_6$ and $R_7$ are the same or different and are substituted alkyl chains selected from a group consisting of $-(CH_2)_nCl$ (n=1-30), $-(CH_2)_nBr$ (n=1-30), and $-(CH_2)_nI$ (n=1-30).

13. The composition of claim 12, wherein the triblock polymer precursor produced has a number average molecular weight range of between 3 kDa to 150 kDa.

* * * * *